United States Patent [19]
Hsu

[11] Patent Number: 6,127,075
[45] Date of Patent: Oct. 3, 2000

[54] METHOD FOR CHECKING ACCURACY OF A MEASURING INSTRUMENT FOR OVERLAY REGISTRATION

[75] Inventor: Tyng-Hao Hsu, Hsin-Chu, Taiwan

[73] Assignee: Mosel Vitelic Incorporated, Hsin-Chu, Taiwan

[21] Appl. No.: 09/164,043

[22] Filed: Oct. 1, 1998

[30] Foreign Application Priority Data

Sep. 8, 1998 [TW] Taiwan ................................. 87114864

[51] Int. Cl.⁷ ...................................................... G03F 9/00
[52] U.S. Cl. ................................................. 430/30; 430/22
[58] Field of Search ......................................... 430/22, 30

[56] References Cited

U.S. PATENT DOCUMENTS

| | | | |
|---|---|---|---|
| 5,601,957 | 2/1997 | Mizutani et al. | 430/22 |
| 5,665,495 | 9/1997 | Hwang | 430/5 |
| 5,733,690 | 3/1998 | Jeong et al. | 430/5 |
| 5,868,560 | 2/1999 | Tamada et al. | 430/5 |
| 5,902,703 | 5/1999 | Leroux et al. | 430/5 |

*Primary Examiner*—Christopher G. Young
*Attorney, Agent, or Firm*—Bacon & Thomas, PLLC

[57] ABSTRACT

A method for checking the accuracy of a measuring instrument used for overlay registration includes the steps of forming a plurality of sets of overlay marks on a calibration mask, each of the overlay marks consisting of an outer box and an inner box, the central point of the outer box being shifted by a predetermined amount relative to the cental point of the inner box. A photoresist layer is then coated atop a control wafer and exposed through the calibration mask. Subsequently, the control wafer is developed to transfer the pattern of the mask to the photoresist layer atop the control wafer. The degree of accuracy of the measuring instrument used for overlay registration can be checked and measured by first taking a deviation of a measured shift amount for each set, which is defined as a difference between the measured shift amount and a corresponding predetermined value, and then taking a mean value of these deviations for all sets.

11 Claims, 2 Drawing Sheets

METHOD FOR CHECKING ACCURACY OF A MEASURING INSTRUMENT FOR OVERLAY REGISTRATION

BACKGROUND OF THE INVENTION

1. Field of the Invention

The present invention relates to a measuring instrument for overlay registration, and more particularly to a method for checking the accuracy of a measuring instrument for overlay registration.

2. Description of the Prior Art

Photolithography processes are crucial steps in fabricating Integrated Circuits and transferring a pattern on a mask to a photoresist layer atop a wafer. Photolithography processes include carrying out photoresist coating, explosing, and developing steps in sequence in a dark room which can prevent the photoresist from being undesirably exposed. Semiconductor devices are fabricated step-by-step, in general by repeatedly carrying out the steps of forming a thin film, then forming a patterned photoresist layer through photolithography processes, and finally etching the thin film using the patterned photoresist layer as a mask, so that alignment between each step and proceeding step is very important for product yield. It is inevitable that a little misalignment always occurs due to instability in the exposing machine, form example in the stepper mechanism. Therefore, in a practical production line, there are ranges of overlay specifications defined by producers as a misalignment tolerance to determine whether the misalignment measured from a measuring instrument for overlay registration can be accepted or not. In order to get higher throughput and yield, this overlay specification of misalignment tolerance for each exposing step should be well defined, i.e, not too tight and not too loose and differs for each exposing step.

In order to be easily aligned, on a scribing line of a mask there is formed an overlay mark which can help align the mask with the proceeding layer having an overlay mark at corresponding positions atop a wafer by overlaying the central points of these two overlay marks. A pilot run wafer is always made to ensure that a misalignment of this pilot wafer measured from a measuring instrument for overlay registration meets the overlay specification for this exposing step as defined by producers, so that all remaining wafers can be safely released. Otherwise, the pilot wafer must be reworked again including removing photoresist and using additional photolithography processes until its misalignment measured by the measuring instrument for overlay registration meets the corresponding overlay specification defined by producers.

Coventionally, an overlay mark created in a "box within box" form, where the "outer" box is greater than the "inner" box and these two boxes have the same concentric point, is commonly used in photolithography processes, as shown in FIG. 1. However a problem arises that there may be some shift amounts between these two central points. Referring to FIG. 1, a proceeding patterned layer formed by the aforesaid depositing and photolithography processes is represented by the inner box constituted by bars labeled 3,4 and left on a scribing line of a wafer. On the other hand, the outer box consitituted by bars lebeled 1,2 is used to represent a patterned photoresist layer atop the wafer formed by exposing and developing and left on a corresponding position of the wafer. "A" and "B" denote the central point of the inner box and that of outer box respectively and a vector is formed by pointing from "A" to "B" to represent a shift vector of an overlay registration, which has a vector component in the X direction denoted by $\Delta X$ and in the Y direction denoted by $\Delta Y$. In other words, $\Delta X$ and $\Delta y$ can represent the shift amount of central point of the outer box relative to that of the inner box in the X and Y directions respectively. When there is no misalignment i.e. "A" and "B" are the same point, the shift vector of the central point of the outer box relative to that of the inner box should be (0,0). The shift vector measured from a measuring instrument for overlay registration according the aforesaid method is obtained under the condition that the measuring instrument has 100 percent accuracy. If not, the measured shift vector has a larger deviation, thus making the product yield more unstable and lowering the quality of product. In a practical production line, the facility engineers carry out a weekly or monthly periodic maintenance to maintain a measuring instrument for overlay registration by using the following method. They take wafers from practical production line representing four crucial steps in Integrated Processes, i.e. SiN, $SiO_2$, poly-Si, and metal layers, and then measure their overlay absolute value by the measuring instrument for overlay registration, by which the engineers can make sure that it has good repeatability for each time of measuring. Measuring accuracy of the measuring instrument for overlay registration itself, however, can not be checked by the aforesaid method. Therefore, the shift vector measured by it is unreliable and results in an unstable product yield. Hence, a method needed to provide which allows for checking measuring accuracy of a measuring instrument for overlay registration itself, thereby making the product yield more stable. Since some misalignment may happen during an exposing process, it is also needed to provide the method for checking measuring accuracy of a measuring instrument for overlay registration, which is not affected by accuracy affecting factor coming from an exposing machine such as a stepper.

SUMMARY OF INVENTION

It is therefore an object of the present invention to provide a method for checking accuracy of a measuring instrument for overlay registration itself.

It is another object of the present invention to provide a method for making product yield more stable by maintaining accuracy of a measuring instrument for overlay registration.

It is a further object of the present invention to provide a method for checking measuring accuracy of a measuring instrument for overlay registration itself, which is not affected by accuracy affecting factor coming from an exposing machine such as a stepper.

According to the present invention, there are a plurality of sets of overlay marks formed on a calibration mask, each of which consists of an outer box and an inner box and has a predetermined shift amount in the central point of the outer box relative to that of the inner box. Next, a photoresist layer is coated atop a control wafer and then exposed through the mask. Subsequently, the control wafer is developed to transfer the pattern of the mask to the photoresist layer atop the control wafer. The accuracy degree of the measuring instrument for overlay registration can then be checked and measured by first taking a deviation of a measured shift amount for each set, which is defined as a difference between the measured shift amount and corresponding predetermined value, and then taking a mean value of the deviations for all sets.

BRIEF DESCRIPTION OF THE DRAWINGS

The objects, features and advantages of the present invention will become apparent from the following detailed description in which.

DESCRIPTION OF THE FIRST PREFERRED EMBODIMENT

Figure 1:
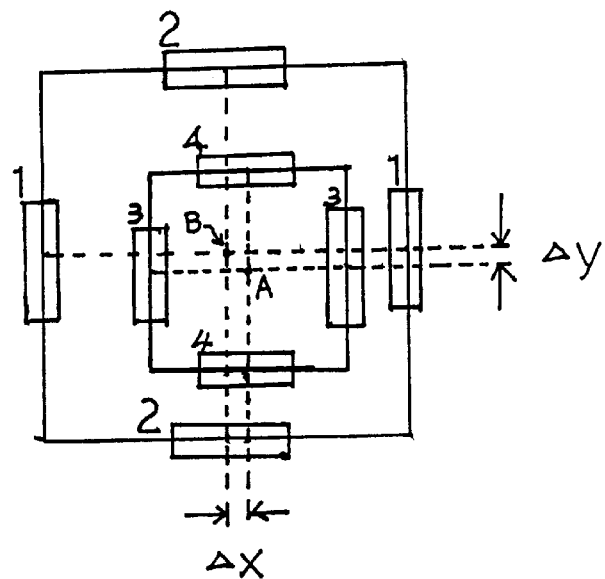
FIG. 1 is a conventional overlay mark created in a "box within box" form.

As aforementioned, an overlay mark is generally designed in a "box within box" form where the "outer" box is larger than the "inner" box and the two boxes have the same central point. The "outer" box represents a patterned photoresist layer after exposing and developing and the "inner" box represents a proceeding patterned layer. Since the "outer" box and the "inner" box have the same concentric point designed originally on each mask, they are supposed to be overlapped at the central point (i.e. concentric point) if misalignment of the two time exposures has not occurred. It is inevitable, however, that some misalignment always occurs due to factors such as an aligning error coming from an aligner and a measuring error from a measuring instrument for overlay registration etc. Hence, as shown in FIG. 1, the shift amount of central point B of the "outer" box relative to that of the "inner" box (i.e. A point), which is equal to the magnitude of a shift vector from A to B, can represent how large the misalignment error is. As explained above, an aligning error coming from an aligner should be excluded so that if there is a difference between real misalignment and measured misalignment obtained from the measuring instrument for overlay registration, it should be attributed to inaccuracy of the measuring instrument for overlay registration. In order to achieve such determination of accuracy, according to the present invention, an outer box and an inner box of overlay marks are formed simultaneously on a mask so as to eliminate an aligning error coming from an aligner because no aligning needed.

On a mask, a plurality of sets of overlay marks are formed, each of which consists of an outer and an inner box and has a predetermined shift amount in the central point of the outer box relative to that of the inner box. Those skilled in the art will appreciate that this method also can work for only one set of overlay marks. The first set of overlay marks starts with a shift vector of (0,0), which means completely aligned, and the following sets are shifted by 0.02 micrometer in the X and Y direction simultaneously until the last set ends with a shift vector of (0.2,0.2), the total number of sets being 11 as shown in the first row from right to left in sequence of FIG. 2. Since a difference of 0.02 micrometer is hardly seen by human eyes, no obvious shift of the outer box can be found in the first row of FIG. 2. In order to evaluate how much the accuracy error is affected by other types of overlay marks, some specially designed types are added and described below. The first one is a negative tone mask, shown in a declined-line area of FIG. 2, whose transparent area and opaque area are exactly reversed relative to that of the positive tone of mask as shown in the nondeclined-line area of FIG. 2. The second one is a "bar to bar" overlay mark, which is originally proposed to resolve problems that corners of a box overlay mark are hardly formed during some etching processes, resulting in generating an error signal when measuring, and the bar is disconnected at four corners shown in the eighth, ninth row of FIG. 2. In addition, all designed overlay marks are laid in a "butterfly" shape so that they will not be too close to generate an error signal when measuring.

Figure 2:
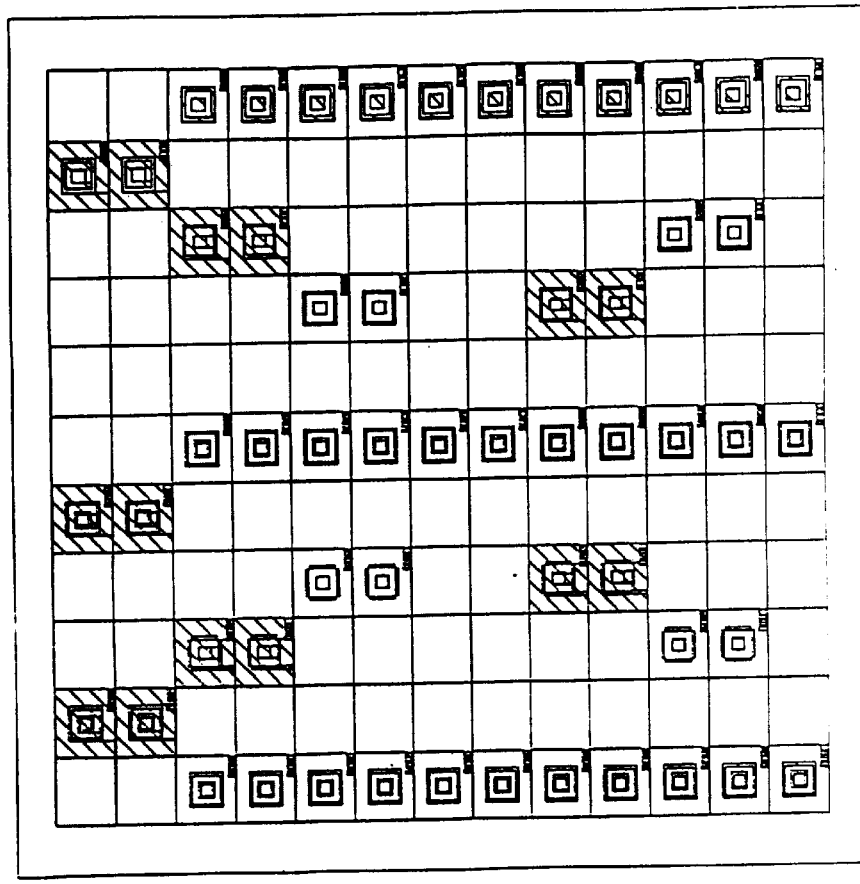
FIG. 2 is a layout diagram of overlay patterns on a mask that permits checking the accuracy of a measuring instrument for overlay registration according to the present invention.

Subsequently, a photoresist layer is coated on a polish wafer (that a starting wafer and hereafter is called control wafer) and then the pattern of FIG. 2 is exposed by an exposing machine such as stepper on the photoresist layer atop the control wafer.

After exposing, the control wafer is developed to transfer the pattern of FIG. 2 to the photoresist layer atop the control wafer. Next, an accuracy degree of a measuring instrument for overlay registration can be checked and measured by first taking a deviation of a measured shift amount for each set, which is defined as a difference between the shift amount and its corresponding predetermined value, and then taking a mean value of the deviations for all sets. In the case of one set of overlay marks, however, a measured shift amount, being equal to a deviation, can represent an inaccuracy degree of the measuring instrument for overlay registration because its predetermined shift vector is (0,0).

DESCRIPTION OF THE SECOND PREFERRED EMBODIMENT

Figure 3:
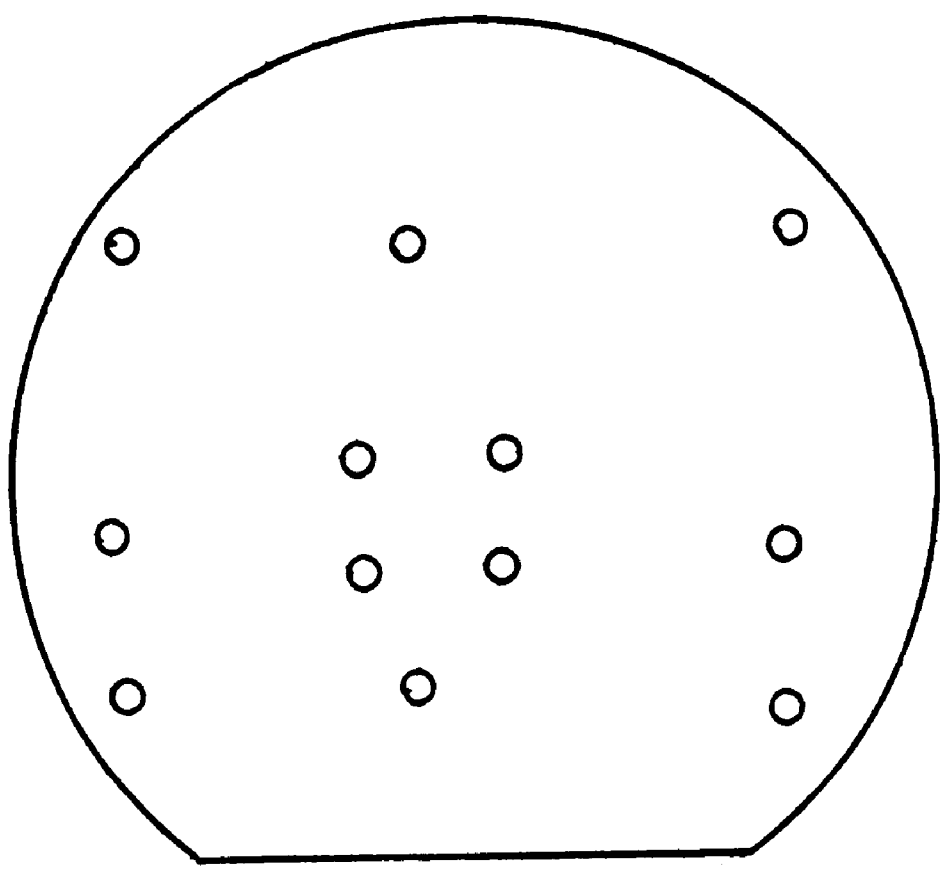
FIG. 3 is a layout diagram of overlay marks shown in FIG. 2 on a control wafer.

There is an alternative method which can further more accurately represent measuring accuracy of a measuring instrument for overlay registration and described as following. After finishing a calibration mask having the pattern of FIG. 2 as aforesaid, a photoresist layer is coated on a polish wafer (that is a starting wafer as in the first preferred embodiment) and then the pattern of FIG. 2 is exposed step-by-step by an exposing machine such as a stepper on different locations of the photoresist layer atop the control wafer. Since different locations of the control wafer may cause some deviations in the measuring result, 12 spots (each spot representing one exposure of the FIG. 2 pattern) are laid on the control wafer, four of which are laid on the central location and the remaining on the circumference of the control wafer as shown in FIG. 3, and then a mean value of measuring results for these 12 spots is taken from a measuring instrument for overlay registration so as to make the mean value more representative and more reasonable. Although we take 12 spots as an example, obvious changes such as number or position of the spots are within scope of the present invention.

After exposing, the control wafer is developed to transfer the pattern of FIG. 2 to 12 spots of the photoresist layer atop the control wafer. Next, a shift amount of the first set of overlay marks is measured for each of 12 spots on the control wafer by a measuring instrument overlay registration such as OSI and their first mean value is taken. If the OSI instrument has 100 percent accuracy, the first mean value should be the same as its corresponding predetermined value, which is equal to (0,0). By the same reason, this situation should be applied to the left 10 sets of overlay marks so as to ensure that the OSI instrument has 100 percent accuracy. If there are deviations of the first mean values by the OSI instrument from its corresponding predetermined value for some sets of overlay marks, we can take a second mean value of the total deviations for the 11 stes of overlay marks to represent how large the degree of inaccuracy of the OSI instrument is. In other words, the amount of deviations is proportional to the degree of inaccuracy of the OSI instrument, thereby allowing the measuring accuracy of the OSI instrument to be checked.

Compared with the prior art of only checking repeatability rather than the accuracy of the OSI instrument by sampling wafers from a production line, the present invention can measure its accuracy by a specially-designed mask pattern and a series of measuring processes as aforementioned, thereby making product yield more stable and raising the quality of product, which is a big benifit to a manufacturer. While particular embodiment of the present invention has been illustrated and described, it would be obvious to those skilled in the art that various other changes and modifications can be made with departing from the spirit and scope of the invention. It is therefore intended to cover in the appended claim all such changes and modifications that are within the scope of the present invention.

What is claimed is:

1. A method for checking accuracy of a measuring instrument for overlay registration, comprising the steps of:

simultaneously forming a set of overlay marks on a calibration mask, said overlay marks including an outer box and an inner box, the outer box being larger than the inner box, wherein the outer and inner boxes having the same central point;

coating a photoresist layer atop a control wafer;

exposing the photoresist layer through the mask and then developing the photoresist layer so as to transfer the set of overlay marks to the photoresist layer atop the control wafer; and using an instrument to measure a shift amount of the central point of the outer box relative to the central point of the inner box on the control wafer, said instrument being an overlay registration measuring instrument, wherein the shift amount represents a degree of inaccuracy of the overlay registration measuring instrument.

2. The method of claim 1, further comprising the step of forming additional overlay marks on said mask, said additional overlay marks including negative tone and bar to bar overlay marks.

3. A method for checking accuracy of a measuring instrument for overlay registration, comprising the steps of:

simultaneously forming a set of overlay marks on a calibration mask, said overlay marks including an outer box and an inner box, the outer box being larger than the inner box, wherein a central point of the outer box is shifted by a predetermined shift amount relative to that of the inner box for each set of overlay marks;

coating a photoresist layer atop a control wafer;

exposing the photoresist layer through the mask and then developing the photoresist layer so as to transfer the plurality of sets of overlay marks pattern to the photoresist layer atop the control wafer;

using an instrument to measure shift amounts of the central point of the outer box relative to the central point of the inner box on the control wafer, said instrument being an overlay registration measuring instrument, determining an accuracy of the measuring instrument for overlay registration by first taking a deviation of the measured shift amount for each set, said deviation being defined as a difference between the measured shift amount and a corresponding predetermined shift amount, and then taking a mean value of deviations for all sets.

4. The method of claim 3, further comprising the step of forming additional overlay marks on said mask, said additional overlay marks including negative tone and bar to bar overlay marks.

5. The method of claim 3, wherein the predetermined shift amount of the central point of the outer box relative to that of the inner box for each set is determined by arranging a first set of overlay marks to have a shift vector of (0,0), by positioning each of the following sets to have a 0.02 micro-meter shift in an X direction and a Y direction simultaneously until the last set ends with a shift vector of (0.2,0.2), a total number of sets being 11.

6. The method of claim 4, wherein the negative tone, bar to bar, and all other overlay marks on the mask are arranged in a butterfly pattern.

7. A method for checking accuracy of a measuring instrument for overlay registration, comprising the steps of:

simultaneously forming a set of overlay marks on a calibration mask, said overlay marks including an outer box and an inner box, the outer box being larger than the inner box, wherein a central point of the outer box is shifted by a predetermined shift amount relative to that of the inner box for each set of overlay marks;

coating a photoresist layer atop a control wafer;

exposing a pattern of the mask step-by-step by an exposing machine on a plurality of spots of the photoresist layer atop the control wafer;

using an overlay registration measuring instrument to measure a shift amount of the first set of overlay marks for these spots and then taking a first mean value for the first set, other mean values for remaining sets of overlay marks being made by a same calculating procedure as was used to take the first mean value for the first set; and taking a second mean value of total deviations of these mean values for all sets to represent an inaccuracy of the measuring instrument.

8. The method of claim 7, wherein the predetermined shift amount of the central point of the outer box relative to that of the inner box for each set is determined by arranging a first set of overlay marks to have a shift vector of (0.0), by positioning each of the following sets to have a 0.02 micro-meter shift in an X direction and a Y direction simultaneously until the last set ends with a shift vector of (0.2,0.2), a total number of sets being 11.

9. The method of claim 7, further comprising the step of forming additional overlay marks on said mask, said additional overlay marks including negative tone and bar to bar overlay marks.

10. The method of claim 9, wherein the negative tone, bar to bar, and all other overlay marks on the mask are arranged in a butterfly pattern.

11. The method of claim 10, wherein the butterfly pattern on the mask is exposed on 12 spots of the photoresist layer atop the control wafer, four of said spots being arranged on a central location of the control wafer and remaining ones of said spots being arranged on the circumference of the control wafer.

* * * * *